United States Patent [19]

Beene et al.

[11] Patent Number: 4,903,120
[45] Date of Patent: Feb. 20, 1990

[54] CHIP CARRIER WITH INTERCONNECTS ON LID

[75] Inventors: Gary L. Beene, Allen; Thomas D. Petrovich, Richardson; Charles E. Williams, Dallas, all of Tex.

[73] Assignee: Texas Instruments Incorporated, Dallas, Tex.

[21] Appl. No.: 801,177

[22] Filed: Nov. 22, 1985

[51] Int. Cl.4 .................. H01L 23/14; H01L 23/02; H01L 27/12
[52] U.S. Cl. ......................................... 357/74; 357/75
[58] Field of Search ..................... 357/74, 75, 80, 72

[56] References Cited

U.S. PATENT DOCUMENTS

| 4,285,002 | 8/1981 | Campbell | 357/74 |
| 4,445,274 | 5/1984 | Suzuki et al. | 357/80 |

FOREIGN PATENT DOCUMENTS

| 0024955 | 3/1981 | Japan | 357/75 |
| 0112745 | 9/1981 | Japan | 357/75 |
| 0032661 | 2/1982 | Japan | 357/74 |
| 0182250 | 10/1983 | Japan | 357/74 |
| 0004061 | 1/1984 | Japan | 357/74 |
| 0084844 | 5/1985 | Japan | 357/74 |

OTHER PUBLICATIONS

"Metallized Ceramic Substrate in the Low Inductance'-'-IBM Technical Disclosure Bulletin-vol. 78, No. 2, Jul. 1985, p. 768.

Primary Examiner—Rolf Hille
Assistant Examiner—S. V. Clark
Attorney, Agent, or Firm—René E. Grossman; Melvin Sharp; John D. Kling

[57] ABSTRACT

A chip carrier with multiple through hole vias in its hermetic sealing lid. One or more chips is mounted on the inner surface of that lid. The lid contains multiple through vias, and the semiconductor chip on the inner surface of the lid is bonded to the vias in the lid by TAB strips or (optionally) by wire bonds. The vias in the lid connect these leads through to contacts on the outer surface of the package. These contacts can than be connected to (using interconnect structures such as TAB strips, or printed wiring boards, or discretionary wiring), to provide circuit interconnection. Preferably low-power-dissipation chips are mounted on the inner surface of the lid in this fashion, with higher-power-dissipation chips mounted on the bottom surface of the chip cavity.

22 Claims, 2 Drawing Sheets

CHIP CARRIER WITH INTERCONNECTS ON LID

BACKGROUND AND SUMMARY OF THE INVENTION

The present invention relates to chip carriers.

In conventional leadless chip-carriers, multiple layers of ceramic (usually alumina-based) are fired together to produce a structure having a cavity in which an integrated circuit chip can be mounted. The chip is connected to bond pads on a shelf inside the cavity, and a lid (e.g. of molybdenum, ceramic, or Kovar) is soldered on to make a hermetic seal on the cavity. Some of the ceramic layers which make up the chip carrier have metal traces patterned on them before firing, to make connections between the bond pads inside the hermetically sealed cavity and contacts on the outside of the chip carrier. Thus, the chip carrier can be mounted on a circuit board by making contact to its external contacts, while the chip remains hermetically isolated.

This technology is fairly mature and reliable, but some of its limitations must now be overcome. For example, at present there is a tremendous thrust towards finding ways to include multiple chips in a chip carrier. While it is possible to put more than one chip in the chip cavity and bond them out using conventional technology, this straightforward approach runs into several problems. One problem is footprint; putting four chips into a carrier should ideally require much less board area than four separate one-chip carriers would; but this advantage will not be fully obtained with prior art technology. Another problem is interconnect; the interconnect topologies permitted by the prior art chip carriers tend to be fairly simple, but optimal design of multi-chip modules would be greatly facilitated by more complex interconnect, particularly if the interconnect routing were reconfigurable, i.e. could be changed for a given cofired-ceramic structure without having to design a new cofired-ceramic structure.

One way to achieve higher density per unit board area in multi-chip chip carriers would be to find some way to stack more than one layer of chips inside the carrier, but some way to make thermal and electrical connection to the upper layer of chips is necessary. Chips generate heat during operation, and in conventional technology much of this heat flows from the chips through the chip carrier's bottom surface (on which the chips are mounted) down through the circuit board; but this thermal path will not be available for all chips if more than one layer of chips is used. Thus, the problem of thermal dissipation is a major barrier to multi-chip packaging.

The present invention permits higher density in multichip carriers, by providing a chip carrier with improved packing density, wherein at least one layer of chips is bonded not to the substrate, but rather to the lid. The present invention replaces the metal lid conventionally used for hermetic sealing with a ceramic lid which includes multiple through vias. A chip can be mounted on the inside of the lid and bonded to pads which are connected, through the vias, to the exterior of the lid. The contacts on the outside of the lid can then be used in a variety of ways. For example, a TAB strip (i.e. a strip of a flexible polymer with conductive traces patterned on it, as used in tape-automated bonding) can be used to connect these contacts to other contacts near the edge of the upper surface of the package; some of these upper surface contacts may be connected, through castellated vias which lead all the way up the side of the package, to external contact pads at the bottom edge of the chip carrier, which can be used to make electrical contact to the circuit board; others of these upper surface contacts may be connected, through traces inside the chip carrier body, to contact pads which make contact with the lower layer of chips, to provide a local bus. Since the connection from the via tops to the upper surface contacts is made after the package is hermetically sealed, the electrical configuration of the package is now reconfigurable. That is, one co-fired ceramic body may be used for a wide variety of interconnect configurations, since the interconnect configuration may be changed by altering the bonding used on the top of the chip carrier.

Moreover, the vias through the lid which the present invention provides may also be used to provide the thermal contact to the chips mounted on the lid. That is, some through vias may not be used for electrical interconnect, but merely for thermal interconnect; and various means known in the prior art may be used to dissipate heat from the outside of the lid. Thus, the present invention provides a multi-chip chip carrier where chips can be mounted in more than one layer, and the upper layer of chips has good heat-sinking.

The present invention also provides a multi-chip chip carrier with a very compact footprint.

The present invention also provides a new routing for interconnect between the chips and the external contact pads of a chip carrier, which permits interconnect topologies which would not otherwise be possible.

Another recent pressure on chip-carrier interconnect technology arises from the increasing use of processors having huge pinout numbers. For example, some kinds of symbolic processors or signal processors may have chip pinouts much greater than 100. This puts tremendous pressure on the interconnect capabilities of the conventional package. Often the interconnect demands on the package external pinouts and on the board can be reduced if such a processor can be packaged together with one or more support chips (such as, e.g., cache memory, bus manager, coprocessor, etc.) to form (in effect) a local bus inside a single package. However, conventional chip carrier technology does not have the interconnect routing flexibility to make such local bus configurations readily achievable.

The present invention may be particularly advantageous in embodiments which use a pad grid type chip carrier, since the contacts along the edge of the chip carrier can be used for bonding out the interconnects which derive from the lid of the carrier, and the other interconnects can be brought out to pads which are not at the edge of the carrier's underside.

Another application of the topside interconnect may be to provide a local bus between carriers; that is, a short TAB strip could be used to connect the topside contacts of one carrier to the topside contacts of one or more adjacent carriers. This configuration is not preferred, since it makes rework, inspection, and testing more difficult, but it does give the board designer another option for interconnect, which may occasionally be advantageous.

Another advantage of the present invention is reliability; organic materials inside a package are a potential source of contaminants, and the present invention provides a way in which the use of organic materials inside the hermietically sealed cavity can be reduced (or avoided altogether), while still taking advantage of the gang bonding and other advantages of TAB technology. That is, the chips mounted on the inside of the lid can be connected to the vias by short bond wires, and TAB strips can be used to make the connections to the via top ends on the outside of the package.

It should be noted that the elements which are to be mounted on the inner surface of the lid do not have to be integrated circuits; some or all of them may be passive components. In fact, the present invention provides a particularly advantageous technology for packaging passive components together with integrated circuits; if a set of passive components is provided in the lid, with their leads brought out through the vias in the lid, discretionary wiring may be used (after the package is sealed) to selectively connect the chips in the package to various ones of the discrete passive elements. Thus, for example, an rf circuit may be reconfigured, by late discretionary interconnects, to operate at any one of several frequencies. Another way of considering this advantage of the invention is that the present invention permits chip carriers to take over some functions which were previously the province of hybrid modules only.

One of the interconnect routings suggested in the prior art of chip carriers is to run vias through the bottom of the chip carrier, so that down-bonding of the chip onto via tops on the floor of the carrier can be connected to (for example) pad grid contacts on the bottom exterior of the carrier. It has been found that, where it is desired to run a via essentially straight through a ceramic wall, hermeticity is best assured by making the via crooked. That is, the via is not simply run straight through, but the layer which is to include the via is constructed as two layers to be fired together; the two layers have matching but slightly offset sets of vias, with a very short lateral trace to join them. This prevents migration of moisture and other contaminants along the microcracks which often form parallel to the via. For similar reasons, the vias through the package lid used in the present invention are preferably formed crooked, to help provide hermeticity.

In addition, the lateral traces used inside the lid do not strictly have be short, nor need they be used merely to join slightly misaligned vias in the layers which make up the lid. In alternative embodiments, these lateral traces buried within the lid may be used to provide still further interconnect complexity. The price of this will normally be that the vias in the lid cannot be made as dense as would otherwise be possible, but in many applications the additional options in interconnect topology may well be worth it.

According to the present invention there is provided: A chip carrier comprising; a chip carrier body defining a cavity therein, said cavity having a substantially planar mounting surface at the bottom thereof and one or more bonding ledges in proximity to said mounting surface within said cavity; external contacts on the exterior of said chip carrier body; a lid hermetically sealed to enclose said cavity in said chip carrier body, said lid comprising conductive vias therethrough; and one or more integrated circuit chips enclosed between said lid and said body within said cavity.

BRIEF DESCRIPTION OF THE DRAWINGS

The present invention will be described with reference to the accompanying drawings, wherein.

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

A sample embodiment of the present invention will now be described. However, it should be recognized that the present invention provides a feature of major novelty in the art of chip packaging, and can be modified and varied to be incorporated in a tremendous variety of embodiments. The scope of the present invention is therefore expressly not limited except as set forth in the allowed claims.

Figure 1:
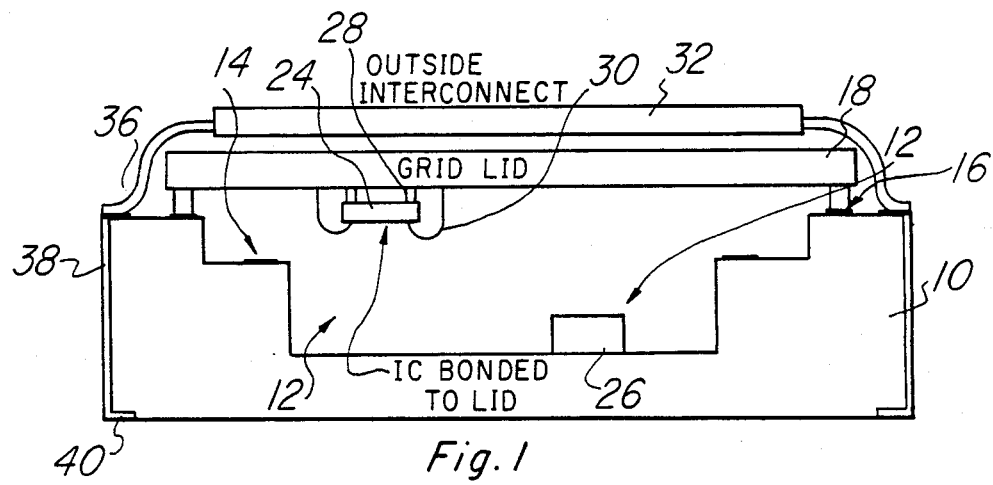
FIG. 1 shows a section view of a simplified sample embodiment of the invention, wherein chips are mounted on the inner surfaces both of the chip carrier body and also of the lid.

FIG. 1 shows a sample embodiment of the invention. A chip carrier body 10 of essentially conventional materials (for example, a fired alumina-based composite) includes a chip cavity 12 surrounded by bonding ledges 14. The upper surface of the chip carrier includes a seal ring 16 to which a lid 18 can be bonded.

Figure 2:
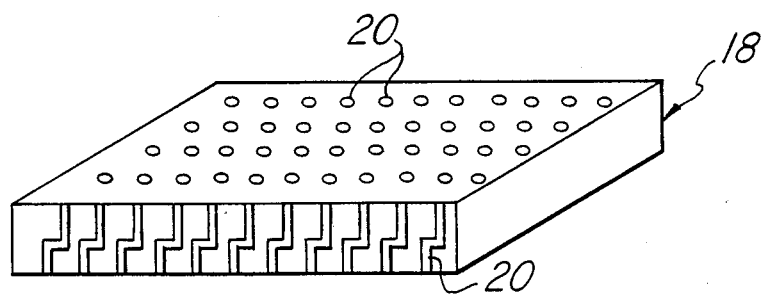
FIG. 2 shows a simple sample configuration for the lid in FIG. 1, with the through vias visible therein.

A closeup view of the lid 18 is used in the present invention as shown in FIG. 2. Note that the lid includes a plurality of vias 20. The lid 18 is preferably made of a fired ceramic, preferably of essentially the same material as the body 10 of the chip carrier. The via holes 20 are filled with metal, and therefore do not degrade the hermetic seal between the lid 18 and the carrier 10 around the seal ring 16.

Preferably the via holes 20 are crooked, as shown in FIG. 2. This is accomplished by constructing the lid 18 in two layers. The upper surface of the bottom layer has short horizontal leads patterned on it, and the upper portion of the lid 18 is aligned so that contact is made with these short intermediate leads when the upper and lower portions of the lid 18 are fired together. The use of these crooked vias is preferable because it provides additional hermeticity.

Figure 3:
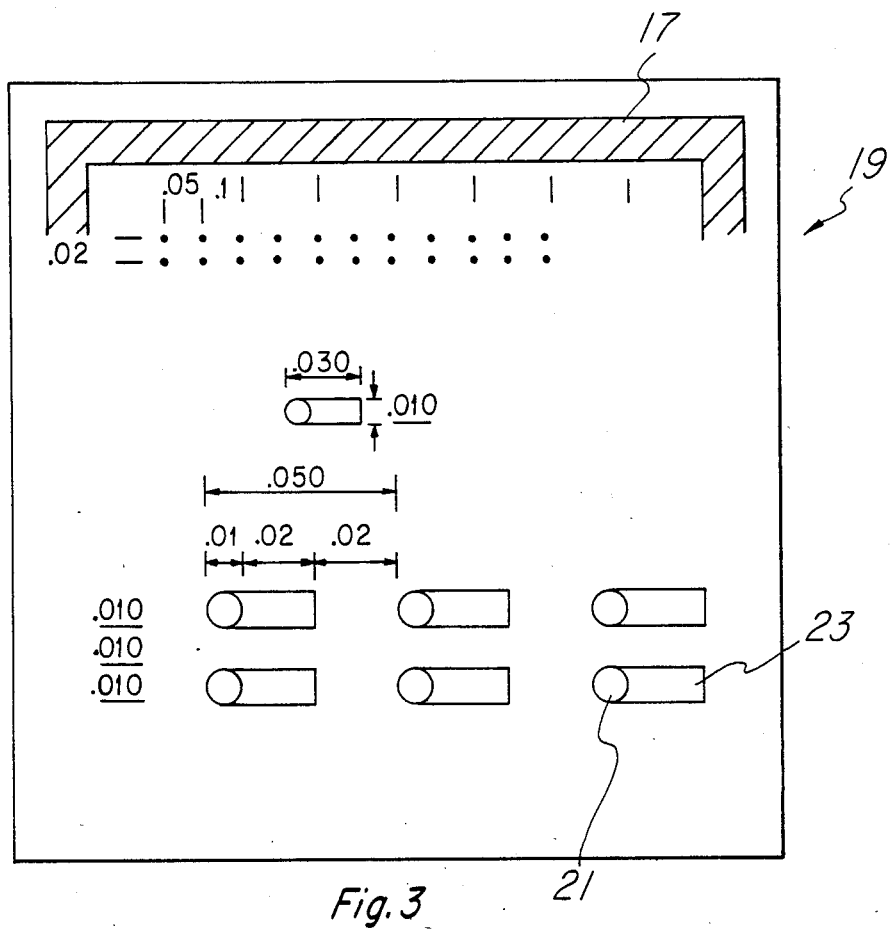
FIG. 3 shows further details and dimensions of a sample embodiment of the lid, including the lateral short traces which permit the two-section vias to be crooked.

FIG. 3 shows further details, including dimensions, of a sample embodiment of the lid 18, showing the substructure of one layer 19 of the lid 18. It can be seen that the vias 20 through the lid 18 are made of subvias 21 through each layer 19, linked by short lateral traces 23. In this example, the subvias 21 are 0.010 inch in diameter, and are spaced on 0.050 inch centers. The lateral traces 23 are about 0.020 inches long, to bridge the offset between the subvias 21 in the separate layers 19. A seal ring 17 is provided so that the two (or more) layers 19 can be bonded together.

In FIG. 1, one integrated circuit 24 is shown bonded to the underside of the lid 18. The thermal and mechanical junction between the chip 24 and the lid 18 is accomplished through a joint 28, which may be an epoxy joint or may be a solder bond. Note that the vias through the lid 18 can function not only electrically but also thermally; that is, one or more vias which run into the backside of chip 24 may be used simply as thermal contacts to the upper surface of the lid 18 when the package is closed, and outside thermal connection may be made to provide some heat sinking of the chip 24. (For example, a small finned heat exchanger may be mounted here.) Bond wires 30 are preferably used to make contact from the chip 24 to desired vias 20 on the inner surface of the lid 18. These bond wires may be attached by conventional thermocompression bonding, or by other means.

Thus, a multitude of chips 24 may be attached to the inner surface of the lid 18 before the lid 18 is assembled to the body of the chip carrier 10.

It would be possible to have traces on the inner surface of the lid 18, in addition to the through hole vias 20 taught by the present invention, but it is primarily desirable to perform interconnection on the outer surface of the lid 18.

As shown in FIG. 1, an outside interconnect structure 32 may be used to make interconnections to the contacts at the outer ends of the vias 20 on the lid 18. Preferably this is done after the lid 18 has been assembled to the chip carrier body 10 and fired to make a seal around seal ring 16. This avoids exposure of the polyimide (which would typically be used if interconnect 32 is configured as a TAB) to the firing temperature.

An important advantage of the present invention is that it minimizes the amount of polyimide which is introduced into the interior of the hermetically sealed cavity 12 in which the chips reside. This helps assure long-term reliability.

An important feature of the present invention is that the lid 18 is not made of a conductive material, as is most common in the prior art. That is, in the prior art of hermetically sealed chip carriers, the usual technology is to use a fired ceramic body 10 with a molybdenum or Kovar lid 18. The present invention, by using a nonconductive lid 18, permits additional interconnect complexity.

It should also be noted that the present invention is not by any means limited to the very simple interconnect topography shown in the sample embodiments of FIGS. 1 and 2. That is, if desired, the lid 18 could be just as complex as the body 10, and could have multiple interconnect levels within multiple ceramic levels which were then fired together.

As FIG. 1 shows, the TAB interconnect which is preferably used as the interconnect 32 can be brought down to bond pad locations 36 on the top of the upper surface of the carrier body 10. These locations 36 can then be connected by vertical metal traces 38 to bondable locations 40 on the undersurface of the package. Thus, the interconnections from the interconnect structure in the lid 18 can be brought down to the board surface without the need for any wiring or TAB interconnects to do so.

The outside interconnect 32 does not have to be made as a TAB strip, but separate wires could be used instead to make this connection. Moreover, note that, if desired, traces could be patterned on the outer surface of the lid 18, to further assist in achieving complex interconnection compactly.

It should also be noted that the outside interconnect 32 can be combined with a TAB connection from the inner surface of the chips 24 to one of the bonding ledges 14, to provide an additional interconnect structure. That is, not all of the leads from the outside interconnect 32 have to be brought out to external contact pads; some of these leads may be used merely to configure a local bus.

It should also be noted that the outside interconnect 32 could alternatively be fabricated using thin film or thick film metallization techniques, and is not by any means required to be limited to TABs or bond wire. In particular, the outside interconnect 32 could also be configured using a small printed wiring board, with small solder bumps which would fuse onto the contacts at the tops of the vias 20.

The present invention is primarily directed to the chip carrier art, but could also be applied to hybrid modules. Hybrid modules, like chip carriers, normally have hermetically sealed lids, and the prior art has not ever (as far as is known) routed interconnects through the lid; thus, the present invention could also be applied in the module art, and would provide substantial advantages in that area too. That is, in the art of hybrid modules, the present invention teaches that a hybrid module should have its lid for hermetic sealing made as a ceramic lid which includes multiple through vias. Components can be mounted on the inside of the lid and bonded to pads which are connected, through the vias, to the exterior of the lid. The contacts on the outside of the lid can then be used in a variety of ways. For example, a TAB strip (i.e. a strip of a flexible polymer with conductive traces patterned on it, as used in tape-automated bonding) can be used to connect these contacts to other contacts near the edge of the upper surface of the module package. Since the connection from the via tops to the upper surface contacts can be made after the module package is hermetically sealed, the electrical configuration of the module is now reconfigurable. That is, one co-fired ceramic body may be used for a wide variety of interconnect configurations, since the interconnect configuration may be changed by altering the bonding used on the top of the chip carrier.

As will be appreciated by those skilled in the art, the present can be widely modified and varied, and its scope is not limited except as specified in the allowed claims.

What is claimed is:

1. A chip carrier comprising:
   a chip carrier body defining a cavity therein, said cavity having a substantially planar mounting surface at the bottom thereof and one or more bonding ledges in proximity to said mounting surface within said cavity;
   external contacts on the exterior of said chip carrier body;
   a lid hermetically sealed to enclose said cavity in said chip carrier body, said lid comprising conductive vias therethrough; and
   one or more integrated circuit chips enclosed between said lid and said body within said cavity;
   wherein a first set of chips (comprising one or more integrated circuit chips) is mounted on said mounting surface, at the bottom of said cavity, and a second set of chips (comprising one or more integrated circuit chips) is mounted on the surface of said lid facing said cavity.

2. The chip carrier of claim 1, wherein said vias through said lid are not entirely straight, but run crooked within said lid.

3. The chip carrier of claim 1,
   wherein said lid comprises a multilayer cofired ceramic structure,
   said vias each comprising straight vias through each of said cofired layers which are mutually misaligned with respect to the straight vias through other of said cofired layers with short lateral interconnects linking said separate vias.

4. The chip carrier of claim 1, wherein a first set of chips (comprising one or more integrated circuit chips) is mounted on said first mounting surface, and a second set of chips (comprising one or more chips) is mounted on the surface of said lid facing said cavity, and at least some of said chips in said second set are bonded to said vias in said lid and are not bonded to said contact pads on said ledges inside said cavity.

5. The chip carrier of claim 4, wherein at least some of said vias are thermally connected with low resistance to said chips in said second set, to provide a heat sinking path through said lid for said chips in said second set.

6. The chip carrier of claim 4, wherein at least some of said chips in said second set are bonded to said vias in said lid and are not bonded to said contact pads on said ledges inside said cavity, and further comprising interconnects linking portions of said vias on the outer surface of said lid to contact pads on the upper surface of said chip carrier body outside the periphery of said lid.

7. The chip carrier of claim 1, further comprising interconnects linking portions of said vias on the outer surface of said lid to contact pads on the upper surface of said chip carrier body outside the periphery of said lid.

8. The chip carrier of claim 7, wherein said contacts on the upper surface of said body are electrically connected to ones of said external contacts on the lower surface of said chip carrier body.

9. The chip carrier of claim 7, wherein said interconnects from said lid to said upper surface of said body comprise at least one flexible polymer strip having a multiplicity of conductive traces supported thereon.

10. The chip carrier of claim 7, wherein said interconnects from said lid to said upper surface of said chip carrier body comprise discrete bond wires.

11. The chip carrier of claim 7, wherein said interconnects from said chip carrier lid to said upper surface of said body comprise a circuit board.

12. The chip carrier of claim 7, wherein said contacts on said upper surface of said body are connected to said external contacts in proximity to said lower surface of said body through castellation vias on the exterior sides of said chip carrier body.

13. The chip carrier of claim 4,
wherein a plurality of contacts from said first set of chips are connected to pads located on the underside of said chip carrier,
and wherein a plurality of contacts from said second set of chips are connected to external contacts at the edge between said underside of said chip carrier and the sides of said chip carrier.

14. The chip carrier of claim 1, wherein said lid also includes traces on its inner surface, in addition to said vias.

15. The chip carrier of claim 1, wherein said lid is concave to define a portion of said cavity therein.

16. The chip carrier of claim 15, wherein said lid also includes bonding ledges in proximity to said cavity therein, said bonding ledges not being coplanar with said second mounting surface.

17. The chip carrier of claim 1, wherein said lid also comprises traces other than said vias embedded within the body thereof, to provide additional interconnect complexity.

18. The chip carrier of claim 1, wherein at least some of said chips are connected to said vias in said lid by interconnects which which do not comprise organic material.

19. A circuit board comprising:
a board substrate;
a plurality of chip carrier packages affixed to said substrate; and
a plurality of traces on said circuit board to interconnect said packages to achieve a predetermined macroscopic circuit configuration;
wherein at least some of said chip carrier packages comprise;
a chip carrier body defining a cavity therein, said cavity having a substantially planar mounting surface at the bottom thereof and one or more bonding ledges in proximity to said mounting surface within said cavity;
external contacts on the exterior of said chip carrier body;
a lid hermetically sealed to enclose said cavity in said chip carrier body, said lid comprising conductive vias therethrough; and
one or more integrated circuit chips enclosed between said lid and said body within said cavity.

20. The board of claim 19, wherein said lid of at least some of said chip carrier packages is concave to define a portion of said cavity therein.

21. The board of claim 19, wherein at least some of said chip carrier packages further comprise interconnects linking portions of said vias on the outer surface of said lid to contact pads on the upper surface of said chip carrier body outside the periphery of said lid.

22. The board of claim 19, wherein at least some of said chip carrier packages comprise both a first set of chips (comprising one or more integrated circuit chips) mounted on said first mounting surface, and also a second set of chips (comprising one or more chips) mounted on the surface of said lid facing said cavity.

* * * * *